United States Patent [19]

Phillips

[11] Patent Number: 4,577,957

[45] Date of Patent: Mar. 25, 1986

[54] BORE-SIGHTED STEP-AND-REPEAT PROJECTION ALIGNMENT AND EXPOSURE SYSTEM

[75] Inventor: Edward H. Phillips, Middletown, Calif.

[73] Assignee: Eaton-Optimetrix, Inc., San Jose, Calif.

[21] Appl. No.: 710,231

[22] Filed: Mar. 11, 1985

Related U.S. Application Data

[63] Continuation of Ser. No. 456,494, Jan. 7, 1983, abandoned.

[51] Int. Cl.⁴ .................. G03B 27/52; G03B 27/70
[52] U.S. Cl. ........................... 355/43; 355/45; 355/53
[58] Field of Search .............. 355/1, 18, 32, 43, 45, 355/46, 53, 54, 67, 78; 354/4; 356/401; 33/180 R; 29/760

[56] References Cited

U.S. PATENT DOCUMENTS

| | | | |
|---|---|---|---|
| 3,192,844 | 7/1965 | Szasz et al. | 355/78 |
| 3,461,566 | 8/1969 | Gerstner | 33/180 |
| 3,476,476 | 11/1969 | Chitayat | 355/1 |
| 3,610,750 | 10/1971 | Lewis et al. | 355/43 |
| 3,685,117 | 8/1972 | Wing et al. | 29/760 |
| 3,704,946 | 12/1972 | Brault et al. | 355/46 |
| 3,716,296 | 2/1973 | Springer et al. | 355/53 |
| 3,853,398 | 12/1974 | Kano | 355/43 |
| 3,876,301 | 4/1975 | Kosugi | 355/53 |
| 3,917,399 | 11/1975 | Buzawa et al. | 355/43 |
| 3,940,211 | 2/1976 | Johannsmeier | 355/53 |
| 3,984,186 | 10/1976 | Momose et al. | 355/45 |
| 4,011,011 | 3/1977 | Hemstreet et al. | 355/18 |
| 4,040,736 | 8/1977 | Johannsmeier | 355/45 |
| 4,057,347 | 11/1977 | Moriyama et al. | 355/67 |
| 4,110,762 | 8/1978 | Tigreat | 354/4 |
| 4,128,331 | 12/1978 | Nakamura | 355/32 |
| 4,311,390 | 1/1982 | Phillips | 356/358 |
| 4,362,389 | 12/1982 | Koizumi et al. | 356/401 |
| 4,367,046 | 1/1983 | Lacombat | 355/53 X |
| 4,414,749 | 11/1983 | Johannsmeier | 33/180 R |
| 4,422,755 | 12/1983 | Phillips | 355/43 |
| 4,437,758 | 3/1984 | Suzuki | 355/53 X |
| 4,452,526 | 6/1984 | Johannsmeier et al. | 355/43 |
| 4,473,293 | 9/1984 | Phillips | 355/53 |

FOREIGN PATENT DOCUMENTS

| | | |
|---|---|---|
| 17759 | 10/1980 | European Pat. Off. . |
| 17044 | 10/1980 | European Pat. Off. . |
| 2009284 | 9/1970 | Fed. Rep. of Germany . |
| 1508408 | 11/1967 | France . |
| 2082213 | 10/1971 | France . |

Primary Examiner—Richard A. Wintercorn
Attorney, Agent, or Firm—Roland I. Griffin

[57] ABSTRACT

A projection lens and a source of illumination and exposure light are employed for projecting an image of a reticle onto a first reference mark or a semiconductive wafer, both of which are movably supported in the image plane of the projection lens. Optical apparatus, including an objective lens unit and an imaging lens, is provided for imaging light from the source of illumination and exposure light at the reticle and for reimaging reflected light from the semiconductive wafer at the objective lens unit. Additional optical apparatus, including a source of nonexposure light, is provided and is operable with the projection lens for imaging a second adjustable reference mark onto the first reference mark or the semiconductive wafer to facilitate use of the projection lens in aligning a semiconductive wafer covered with a photoresist opaque to exposure light.

68 Claims, 13 Drawing Figures

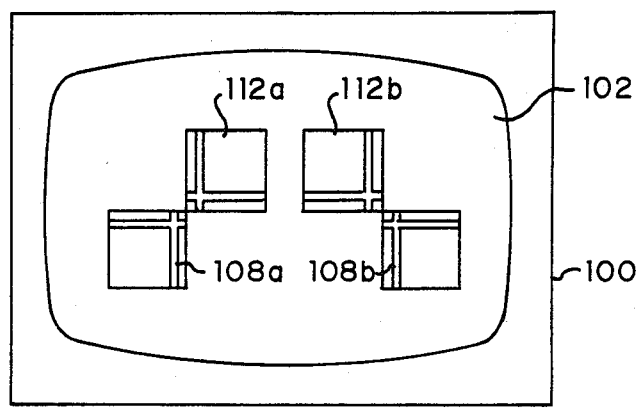
Figure 5
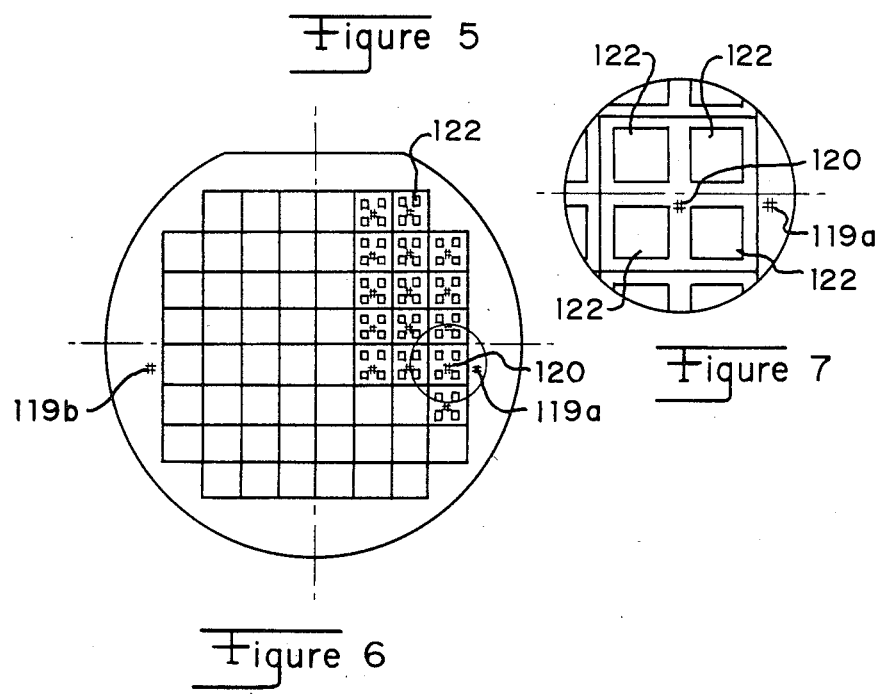
Figure 7
Figure 6
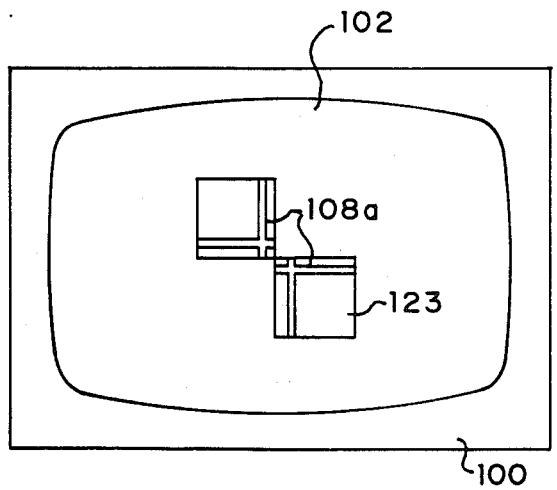
Figure 8A
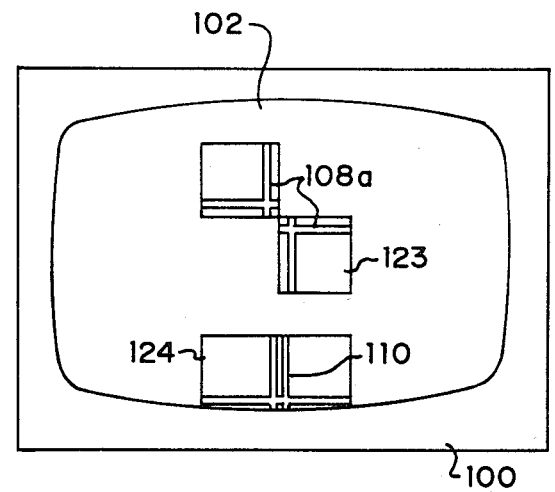
Figure 8B

BORE-SIGHTED STEP-AND-REPEAT PROJECTION ALIGNMENT AND EXPOSURE SYSTEM

CROSS REFERENCE TO RELATED APPLICATION

This is a continuation of application Ser. No. 456,494, filed Jan. 7, 1983 now abandoned.

RELATED APPLICATIONS

The subject matter of this application is related to that of U.S. patent application Ser. No. 396,099 entitled IMPROVED STEP-AND-REPEAT PROJECTION ALIGNMENT AND EXPOSURE SYSTEM and filed on July 7, 1982 by Edward H. Phillips (issued as U.S. Pat. No. 4,473,293 on Sept. 25, 1984), which is a continuation of U.S. patent application Ser. No. 026,722 filed on Apr. 3, 1979, (abandoned) and to that of co-pending U.S. patent application Ser. No. 710,232 entitled BORE-SIGHTED STEP-AND-REPEAT PROJECTION ALIGNMENT AND EXPOSURE SYSTEM and filed on Mar. 11, 1985, by Edward H. Phillips, which is a continuation of U.S. patent application Ser. No. 389,678 filed on June 18, 1982. The aforementioned U.S. applications are assigned to the same assignee as the present application, are incorporated herein by reference, and are hereinafter referred to by serial number alone.

BACKGROUND AND SUMMARY OF THE INVENTION

This invention relates generally to step-and-repeat alignment and exposure systems for aligning each of an array of different regions of an object, such as a semiconductive wafer, with respect to an image of another object, such as a reticle, and for photometrically printing that image at each of those regions by employing a projection lens of the reduction type. More specifically, this invention relates to improved and simplified optical apparatus for use in such systems to facilitate utilization of the projection lens in aligning each region of the semiconductive wafer with respect to the image of the reticle.

In U.S. patent application Ser. No. 396,099 an improved step-and-repeat alignment and exposure system is disclosed that may be employed for aligning each of an array of inchoate dice regions of a semiconductive wafer with respect to an image of a main reticle containing a level of microcircuitry to be photometrically printed at each of those inchoate dice regions. The system includes a main stage movable along orthogonal axes of motion of the system, a substage mounted on the main stage for aligning a reference mark with respect to the orthogonal axes of motion of the system, a rotatable vacuum chuck mounted on the main stage for holding the semiconductive wafer, a reticle stage mounted above the main stage for holding the main reticle, and a projection lens disposed between the main stage and the reticle stage and operable with an associated beam splitter and an associated split-field objective lens unit for directly viewing in aerial image of the image of tne main reticle and also of the reference mark or the semiconductive wafer depending on the position of the main stage.

Thus, while employing the projection lens and its associated split-field objective lens unit to directly view the aerial image of the image of the main reticle and also of the reference mark, the main stage and the substage can be employed to align the reference mark with respect to the orthogonal axes of motion of the system during a reference mark set-up alignment operation, and the main stage and the reticle stage can thereafter be employed to align images of global alignment marks disposed at opposite sides of the main reticle with respect to corresponding portions of the reference mark and, hence, with respect to the orthogonal axes of motion of the system during a main reticle alignment operation. Similarly, while subsequently employing the projection lens and its associated split-field objective lens unit to directly view the image of the image of the main reticle and also of the semiconductive wafer, the main stage can be employed to alternately align global alignment marks disposed at opposite sides of the semiconductive wafer with respect to the images of the global alignment marks of the main reticle to align the semiconductive wafer as a whole with respect to the orthogonal axes of motion of the system during a global wafer alignment operation, and thereafter to align local alignment marks disposed between selected ones of the inchoate dice regions of the semiconductive wafer with respect to an image of a corresponding local alignment mark on the main reticle to more precisely align each inchoate dice region with respect to the image of the main reticle during a precision region-by-region or local wafer alignment operation.

The projection lens is corrected for blue exposure light having a wavelength of 436 nanometers so that the projection lens can be employed to photometrically print the level of microcircuitry contained on the main reticle at each inchoate dice region of the semiconductive wafer, once that region is aligned with respect to the image of the main reticle, in precise alignment with other previously or yet-to-be printed levels of microcircuitry by exposing a photoresistive film on that region in accordance with that image during a wafer exposure operation. A controllable light source unit, an associated plurality of masking elements, another beam splitter and an imaging lens disposed between that beam splitter and the main reticle are provided for selectively illuminating different portions of the main reticle with exposure light so that the global and local alignment marks of the semiconductive wafer can be illuminated with exposure light during the global and precision local wafer alignment operations performed with the projection lens and its associated split-field objective lens unit without exposing the photoresistive film on each inchoate dice region. However, due to interference patterns that may be created for some photoresistive films or other surface conditions of the semiconductive wafer at the wavelength of the exposure light for which the projection lens is corrected, it is often desirable to employ a photoresistive film that is opaque to the exposure light. In this case the projection lens and its associated split-field objective lens unit cannot be employed in performing the global and precision local wafer alignment operations.

The controllable light source unit can be adjusted to selectively illuminate the reticle with green nonexposure light having a wavelength of 546 nanometers, and a compensating lens can be moved into position to compensate the projection lens for the green nonexposure light during global and precision local wafer alignment operations involving a photoresistive film that is opaque to the exposure light. However, a serious disadvantage of this technique is the loss of time in adjusting the controllable light source unit and moving the compensating lens into position for the global and precision local wafer alignment operations and thereafter readjusting the controllable light source unit and moving the compensating lens back out of position for the wafer exposure operation. Moreover, the image plane of the projection lens may be shifted by the compensating lens, thereby resulting in the possibility of serious alignment errors.

In U.S. patent application Ser. No. 389,678 a bore-sighted step-and-repeat alignment system is disclosed in which the projection lens may be employed without a compensating lens in performing global and precision local wafer alignment operations involving a photoresistive film that is opaque to the exposure light. This system also employs a split-field objective lens unit, operable with the beam splitter, the projection lens and a source of exposure light (employed in place of the controllable light source unit), for directly viewing aerial images of images of the global alignment marks of the main reticle and also of the corresponding portions of the reference mark to facilitate alignment of the images of those global alignment marks with respect to the reference mark during the main reticle alignment operation. A first single-channel objective lens unit, operable with a chromatic beam splitter, a nonchromatic beam splitter, the projection lens and the source of exposure light, is employed for directly viewing an aerial image of an image of another alignment mark disposed on the main reticle between the global alignment marks and also of a corresponding portion of the reference mark to facilitate alignment of that corresponding portion of the reference mark with respect to the image of the other alignment mark. In addition, a second single-channel objective lens unit, operable with both the chromatic and nonchromatic beam splitters, the projection lens and a first source of yellow nonexposure light having a wavelength of 577 nanometers, is employed for imaging an alignment mark of an adjustable alignment reticle at the image plane of the projection lens and for directly viewing an aerial image of the image of that alignment mark and also of a corresponding portion of the reference mark. This facilitates adjustment of the alignment reticle to align the image of its alignment mark with respect to the corresponding portion of the reference mark and, hence, with respect to the image of the other alignment mark of the main reticle in a bore-sighting alignment reticle set-up alignment operation. The bore-sighting alignment reticle set-up alignment operation can be repeated as frequently as desired during the operation of the bore-sighted step-and-repeat alignment and exposure system to maintain the alignment accuracy of the system.

Following the bore-sighting alignment reticle set-up alignment operation, the second single-channel objective lens unit can be employed for directly viewing an aerial image of the image of the alignment mark of the alignment reticle and also of each global alignment and local alignment mark of the semiconductive wafer to facilitate alignment of each of those alignment marks of the semiconductive wafer with respect to the image of the alignment mark of the alignment reticle during the global and precision local wafer alignment operations. Additional optical apparatus, including an apertured field-stop plate and a second source of yellow nonexposure light, is employed for illuminating the entire field viewed in the image plane of the projection lens by the second single-channel objective lens unit with the yellow nonexposure light to facilitate locating the global alignment marks of the semiconductive wafer during the global wafer alignment operation.

A disadvantage of both of the foregoing step-and-repeat projection alignment and exposure systems is that the nonchromatic beam splitter associated with each split-field objective lens unit is not a commercially available off-the-shelf part. Concomittantly, neither the projection lens nor either split-field objective lens unit is a commercially available off-the-shelf part. Moreover, the optical portions of both systems are relatively complex, and different light sources are employed for alignment and exposure operations resulting in possible misalignments due to different intensity distributions of those light sources.

Accordingly, it is the principal object of this invention to provide an improved step-and-repeat projection alignment and exposure system in which the need for the aforementioned nonchromatic beam splitter is eliminated and in which a commercially available off-the-shelf projection lens and a commercially available off-the-shelf split-field objective lens unit can be employed.

Another object of this invention is to provide a step-and-repeat projection alignment and exposure system, such as either of the aforementioned systems, with improved and simplified optical apparatus for use in performing the aforementioned reticle and wafer alignment operations.

Another object of this invention is to provide an improved step-and-repeat projection alignment and exposure system in which one light source is employed for both alignment and exposure operations, thereby eliminating possible misalignments due to different intensity distributions of different light sources.

Still another object of this invention is to provide an improved and simplified bore-sighted step-and-repeat projection alignment and exposure system.

These and other object, which will become apparent from a reading of this specification and an inspection of the accompanying drawings, are accomplished according to the illustrated preferred embodiment of this invention by employing a source of exposure light including a shutter with a neutral density filter operable, when the shutter is closed, for passing enough exposure light to illuminate the main reticle without exposing the photo-resistive film on the semiconductive wafer; by replacing the nonclaromatic beam splitter disposed between the main reticle and the projection lens with a cold mirror disposed for reflecting exposure light from the source of exposure light and for transmitting nonexposure light from first and second sources of nonexposure light; by replacing the split-field objective lens unit operable with the replaced nonchromatic beam splitter with a split-field objective lens unit operable with the other beam splitter and the imaging lens, mentioned above in connection with the system disclosed in U.S. patent application Ser. No. 396,099, for directly viewing an aerial image of illuminated portions of the main reticle and of the reference mark or the semiconductive wafer; and by employing a silicon intensified TV camera and an associated TV monitor for displaying that image.

DESCRIPTION OF THE DRAWINGS

FIG. 5 is a split-field view of portions of the reference mark illuminated by images of a pair of global alignment marks of a first or higher level main reticle as viewed on the face of a first TV monitor of the system of FIGS. 1A and 1B.

FIG. 6 is a plan view of a semiconductive wafer employed in the system of FIGS. IA and IB.

FIG. 7 is an enlarged plan view of a portion of the semiconductive wafer of FIG. 6.

FIGS. 8A and 8B are views of portions of the reference mark illuminated by an image of another alignment mark of a main reticle used for positive photoresists and by an image of another alignment mark of a main reticle used for negative photoresists, respectively, as viewed on the face of the first TV monitor of the system of FIGS. 1A and 1B.

DESCRIPTION OF THE PREFERRED EMBODIMENT

Figure 1A:
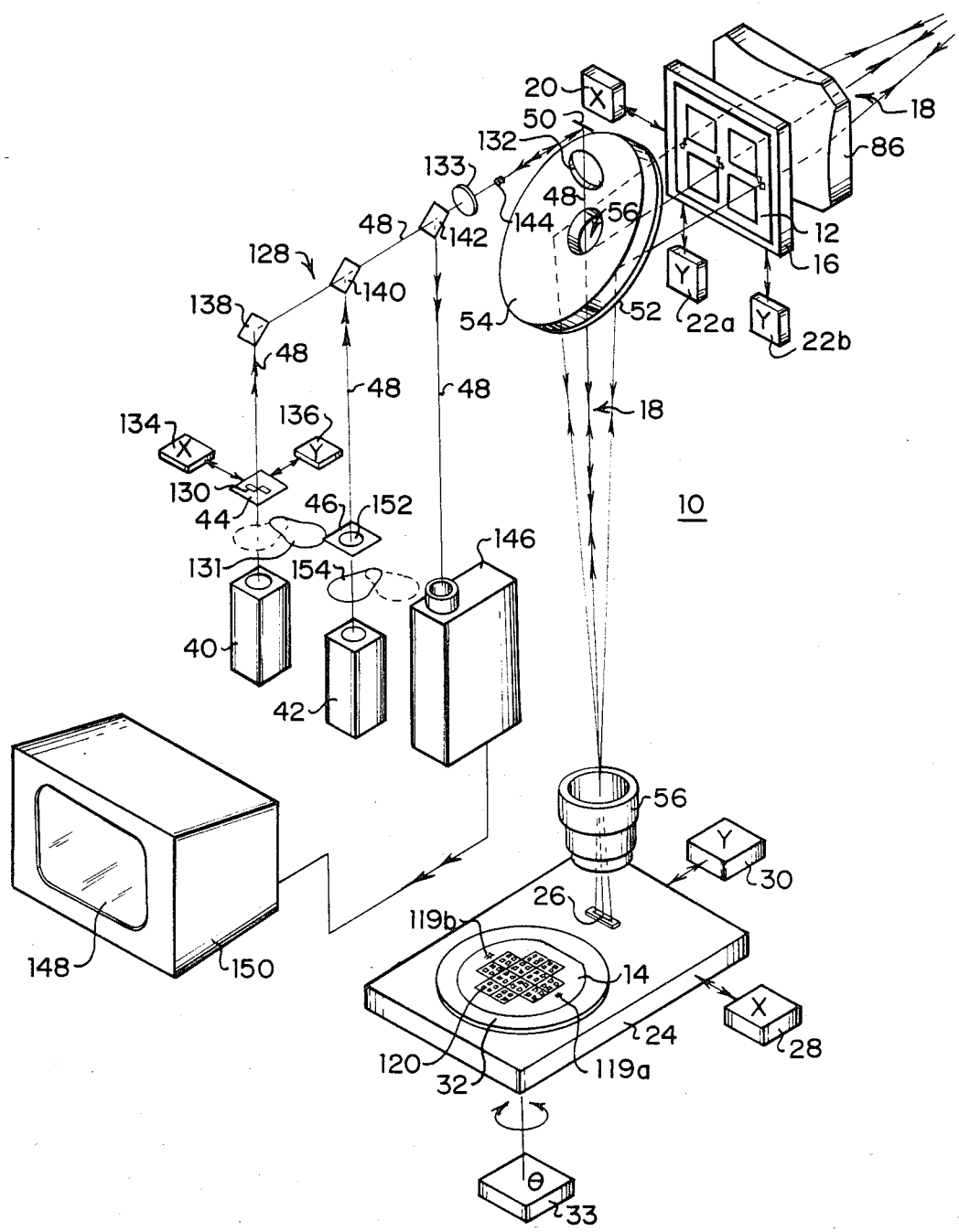
FIGS. 1A and 1B comprise an isometric view of an improved bore-sighted step-and-repeat projection alignment and exposure system according to the preferred embodiment of this invention.

Referring now to FIGS. IA and IB, there is shown a precision bore-sighted step-and-repeat alignment and exposure system 10 for repeatedly photometrically printing a level of microcircuitry contained on a first object, such as a main reticle 12, at an array of adjacent regions of a second object, such as a semiconductive wafer 14, in alignment with other levels of microcircuitry previously printed or yet to be printed at each of those same regions. A reticle stage 16 is employed for holding the main reticle 12 along a horizontally-extending portion of an optical path 18 of the system 10 and is provided with a clearance opening for permitting passage of light through the main reticle. The reticle stage 16 may be moved along orthogonal X and Y axes and rotated about an orthogonal Z axis of the reticle stage by an X-axis servo drive unit 20 and a pair of differential Y-axis servo drive units 22a and 22b coupled to the reticle stage. A main stage 24 is employed for holding the semiconductive wafer 14 and a reference mark 26 and for selectively positioning them along a vertically-extending portion of the optical path 18. The main stage 24 may be moved along orthogonal X and Y axes of the main stage by an X-axis servo drive unit 28 and a Y-axis servo drive unit 30 coupled to the main stage. A rotatable vacuum chuck 32 mounted on the main stage 24 is employed for holding the semiconductive wafer 14 on the main stage. The vacuum chuck 32 may be rotated about an axis parallel to a Z axis of the main stage 24 by a $\theta$ servo drive unit 33 coupled to the vacuum chuck.

A source 34 of blue exposure light having a wavelength of about 436 nanometers is employed both for illuminating the main reticle 12 and for exposing a photo-resistive film on the semiconductive wafer 14. The exposure light is directed along a first vertically extending portion of an optical path 36 to a nonchromatic splitter 38, which is disposed so as to reflect eighty percent of the incident exposure light from that portion of that optical path along the horizontally-extending portion of the optical path 18 towards the main reticle 12. First and second sources 40 and 42 of yellow nonexposure light having a wavelength of about 577 nanometers are employed for illuminating an adjustable alignment reticle 44 and an apertured fieldstop plate 46, respectively, without exposing the photo-resistive film on the semiconductive wafer 14. The nonexposure light is directed along an optical path 48 to a plane mirror 50, which is disposed so as to reflect the incident nonexposure light along a first vertically-extending portion of that optical path and into the vertically-extending portion of the optical path 18 towards the semiconductive wafer 14 (the first vertically-extending portion of the optical path 48 adjoins the vertically-extending portion of the optical path 18).

A cold mirror 52 is disposed between the reticle stage 16 and the main stage 24 and employed for bidirectionally reflecting exposure light from one portion of the optical path 18 to the other portion of the same optical path and for bidirectionally transmitting nonexposure light between the adjoining vertically-extending portions of the optical paths 18 and 48. The cold mirror 52 is bonded to a glass substrate 54 with a circular clearance opening 56 permitting nonexposure light to pass directly through the cold mirror between the adjoining vertically-extending portions of the optical paths 18 and 48 (i.e., without traversing the glass substrate). A 10:1 reduction-type projection lens 56 is disposed along the vertically-extending portion of the optical path 18 between the cold mirror 52 and the main stage 24 and employed for projecting an image of the illuminated main reticle 12 into an image plane of the projection lens during alignment and exposure operations as hereinafter described. The projection lens 56 is also employed for projecting an image of either the illuminated alignment reticle 44 or the illuminated apertured fieldstop plate 46 into the same image plane during alignment operations as hereinafter described. In any case, the main stage 24 is employed for positioning the semiconductive wafer 14 or the reference mark 26 in the image plane of the projection lens 56 along the vertically-extending portion of the optical path 18 and with respect to the projected image of the illuminated main reticle 12 or of the illuminated alignment reticle 44.

Figure 1B:
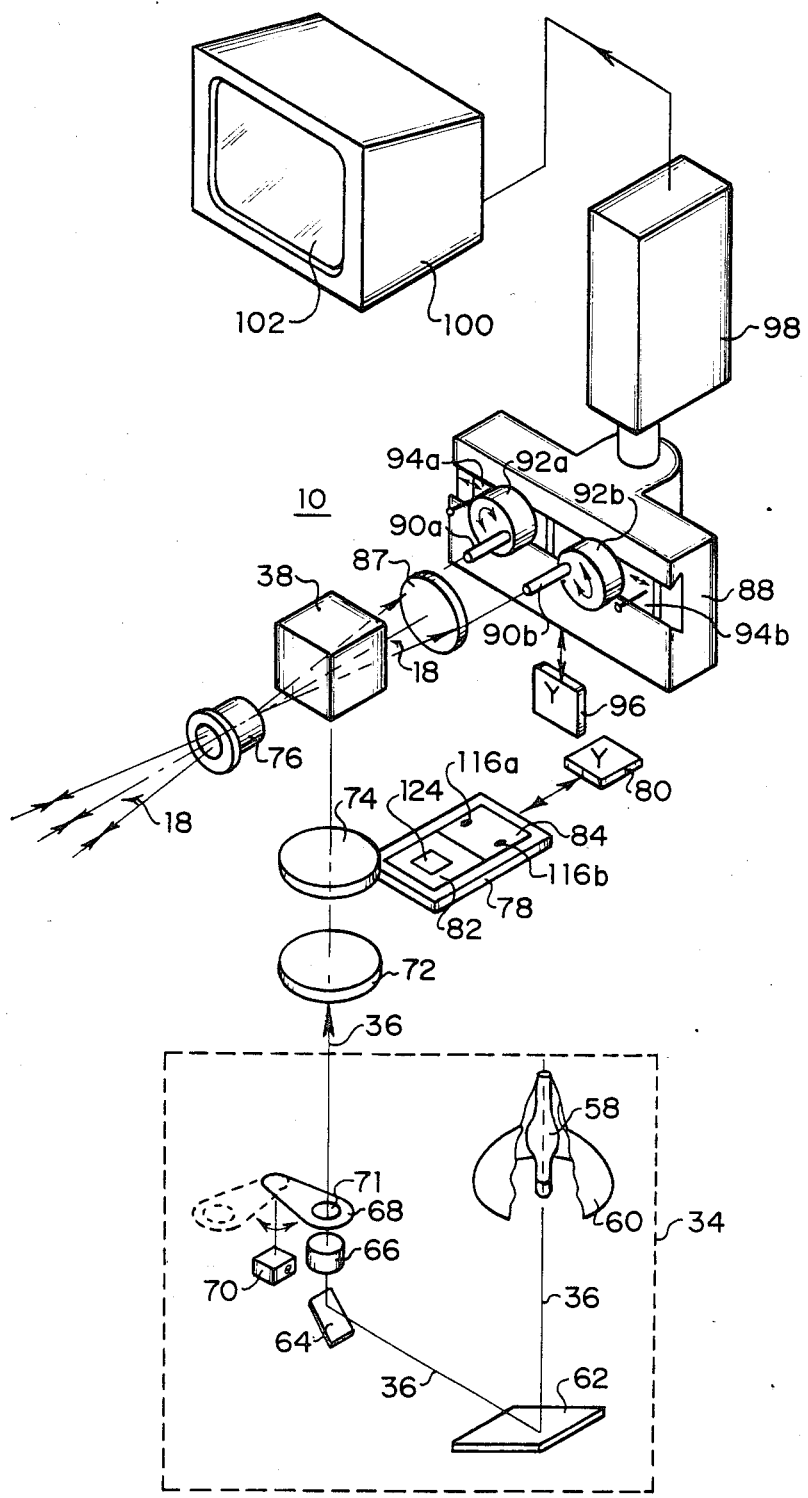

With reference now primarily to FIG. 1B, the source 34 of exposure light includes a mercury arc lamp 58 for emitting a spectrum of light energy including the blue exposure light. An elliptical reflector 60 surrounds the mercury arc lamp 58 and is coaxially mounted therewith for projecting a beam of light emitted by the mercury arc lamp downward along a second vertically-extending portion of optical path 36 to a band reflecting plane mirror 62. The band reflecting plane mirror 62 has a multilayer dielectric coating for reflecting the blue exposure light, but transmitting all other light, and is disposed so as to reflect only the blue exposure light in the beam of light from mercury arc lamp 58 along a horizontally-extending portion of optical path 36 to a plane mirror 64. Concomitantly, the plane mirror 64 is disposed so as to reflect the blue exposure light incident thereon upward along the first vertically-extending portion of optical path 36 through a light integrator 66 disposed in that portion of that optical path towards the beam splitter 38.

The light integrator 66 is employed for providing the beam of blue exposure light passing therethrough with a cross section corresponding to the entrance pupil of the projection lens 56 and with a uniform intensity distribution in the plane of the main reticle 12. A shutter 68 is pivotally mounted adjacent to the first vertically-extending portion of optical path 36 between the light integrator 66 and the beam splitter 38 and is controlled by a $\theta$ servo drive unit 70 for pivotal movement into that optical path when closed (as shown in solid lines) and out of that optical path when opened (as shown in dashed lines). The shutter 68 has a circular (ND$_3$) neutral density filter 71 mounted therein and operable, when the shutter is closed, for passing only about one-thousandth of the blue exposure light from the light integrator 66 to the beam splitter 38 so as to illuminate the main reticle 12 with sufficient intensity to be picked up by a silicon intensified TV camera as hereinafter described, but with insufficient intensity to expose the photoresistive film on the semiconductive wafer 14. When the shutter 68 is opened, all of the blue exposure light from the light integrator 66 passes to the beam splitter 38 so as to illuminate the main reticle 12 and to expose the photoresistive film on the semiconductive wafer 14 in accordance with the pattern of the illuminated main reticle.

Two positive lenses 72 and 74 are also disposed in the first vertically-extending portion of optical path 36 between the source 36 of blue exposure light and the beam splitter 38 to image the output of the light integrator 66 at the input pupil of an imaging lens 76 disposed in the horizontally-extending portion of optical path 18 between the beam splitter and the reticle stage 16. A slide 78 is mounted for movement along a Y axis of the slide under control of a Y-axis servo drive unit 80 to selectively position either of two different mask plates 82 and 84 at an operative position directly between positive lenses 72 and 74 in a horizontal plane orthogonally intersecting the first vertically-extending portion of optical path 36 at a point midway between those positive lenses.

As shown in FIGS. 1A and 1B, the blue exposure light appearing in the horizontal plane midway between the positive lenses 72 and 74 is imaged by the imaging lens 76 onto selected portions or all of the main reticle 12 during alignment and exposure operations as hereinafter described and as determined by whether or not one of the mask plates 82 and 84 is located in the operative position (and, if so, which one). Another positive lens 86 is disposed in the horizontally-extending portion of the optical path 18 between the imaging lens 76 and the reticle stage 16 so as to image the blue exposure light, which appears at the output pupil of the imaging lens (and which passes through the main reticle 12 and is reflected by the cold mirror 52), at the input pupil of the projection lens 56. The blue exposure light so imaged is projected downwardly along the vertically-extending portion of the optical path 18 by the projection lens 56 to provide an image of the illuminated portions of the main reticle 12 in the image plane of the projection lens as previously mentioned.

The blue exposure light projected into the image plane of the projection lens 56 is reflected from the semiconductive wafer 14 or the reference mark 26, depending upon which one is positioned in that image plane and in the vertically-extending portion of the optical path 18. This reflected blue exposure light passes upwardly along the vertically-extending portion of the optical path 18 through the projection lens 56 to the cold mirror 52, from which the reflected blue exposure light is in turn reflected along the horizontally-extending portion of the optical path 18 through the main reticle 12. The positive lens 86 serves to image the reflected blue exposure light emanating from the input pupil of the projection lens 56 at the output pupil of the imaging lens 76. Twenty percent of the reflected blue exposure light so imaged is transmitted by the beam splitter 38 to a positive lens 87 disposed in the horizontally-extending portion of the optical path 18.

The imaging lens 76 serves to image the reflected blue exposure light, which appears at the main reticle 12 and is transmitted by the beam splitter 38, at the object plane of a split-field objective lens unit 88 (with that object plane being optically the same distance from the input pupil of the imaging lens as the horizontal plane midway between the positive lenses 72 and 74 is from the input pupil of the imaging lens). Concomitantly, the positive lens 87 serves to image the reflected blue exposure light, which emanates from the input pupil of the imaging lens 76, at infinity so that the reflected blue exposure light is telecentrically imaged at the object plane of the split-field objective lens unit 88. This provides in that object plane an image of both the aforementioned image of the illuminated portions of the main reticle and of those portions of the semiconductive wafer 14 or the reference mark 26 illuminated by the aforementioned image of the illuminated portions of the main reticle.

The split-field objective lens unit 88 may comprise, for example, a Zeiss MJM mask alignment microscope with a pair of objective lenses 90a and 90b. These objective lenses 90a and 90b are mounted on corresponding manually-rotatable turrets 92a and 92b, which are in turn mounted on corresponding manually-translatable slides 94a and 94b. The turrets 92a and 92b and the slides 94a and 94b are disposed so that the objective lenses 90a and 90b can be manually rotated or manually moved laterally (along an X axis of the split-field objective lens unit 88) relative to one another as may be desired to permit viewing of different portions of the image at the object plane of the split-field objective lens unit or to permit either split-field (dual channel) or single field (single channel) viewing of that image. A Y-axis servo drive unit 96 is coupled to the split-field objective lens unit 88 to facilitate vertical adjustment of the objective lenses 90a and 90b (along a Y axis of the split-field objective lens unit).

Depending on the position of the objective lenses 90a and 90b, a dual channel or a single channel view of the image appearing in the object plane of the split-field objective lens unit 88 is provided at an optical output port of the split-field objective lens unit. A silicon intensified TV camera 98 is coupled to the output port of the split-field objective lens unit 88 and to a first TV monitor 100 so as to display the dual channel or single channel view of that image on the display screen 102 of the first TV monitor. While viewing the display screen 102 of the first TV monitor 100, an operator may control the main stage 24 to position the semiconductive wafer 14 or the reference mark 26 and may also control the reticle stage 16 to position the main reticle 12 in performing the alignment operations as hereinafter described.

As disclosed in U.S. patent application Ser. Nos. 396,009 and 389,678, the reference mark 26 is employed in performing some initial set-up alignment operations and in performing a main reticle alignment operation. The reference mark 26 may be formed of bright chrome on a substage 104 of the main stage 24. As further disclosed in those U.S. patent applications, the substage 104 may be employed during a reference mark set-up alignment operation to pivot the reference mark 26 with respect to the image plane of the projection lens 56 so as to precisely position the reference mark in and parallel to the image plane of the projection lens and may be further employed to pivot the reference mark with respect to a plane orthogonal to the image plane of the projection lens so as to precisely align the reference mark with respect to the orthogonal X and Y axes of motion of the main stage 24. Once the reference mark 26 is so aligned it serves as a visual indication of the orthogonal X and Y axes of motion of the main stage 24 and thereby facilitates use of those axes of motion as an absolute frame of reference for the system 10.

Figure 2:
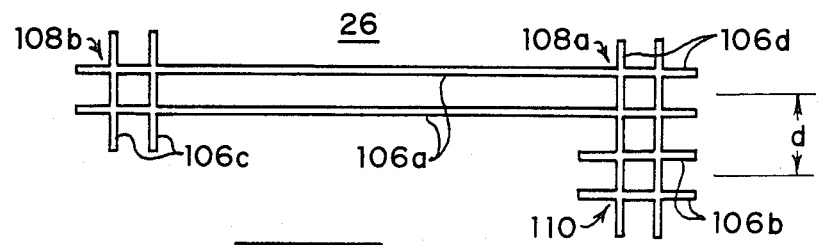
FIG. 2 is a plan view of a reference mark formed on a substage of a main stage of the system of FIGS. 1A and 1B.

As shown in FIG. 2, the reference mark 26 may comprise a first pair of parallel lines 106a and a second pair of shorter parallel lines 106b disposed adjacent to and spaced a finite center-to-center distance d (for example, 100 microns) from the right-hand end of the first pair of parallel lines. All of these parallel lines 106a and 106b are to be aligned with respect to the X axis of motion of the main stage 24. The reference mark 26 may further comprise a left-hand pair of parallel tic marks 106c orthogonally intersecting the left-hand end portion of the first pair of parallel lines 106a to form a left-hand, double-cross alignment mark 108b, and a right-hand pair of longer parallel tic marks 106d orthogonally intersecting both the right-hand end portion of the first pair of parallel lines 106a and the adjacent second pair of parallel lines 106b to form two right-hand, double-cross alignment marks 108a and 110, respectively. Alignment of the parallel lines 106a and 106b with respect to the X axis of motion of the main stage 24 automatically aligns all of the tic marks 106c and 106d with respect to the Y axis of motion of the main stage.

Figure 3:
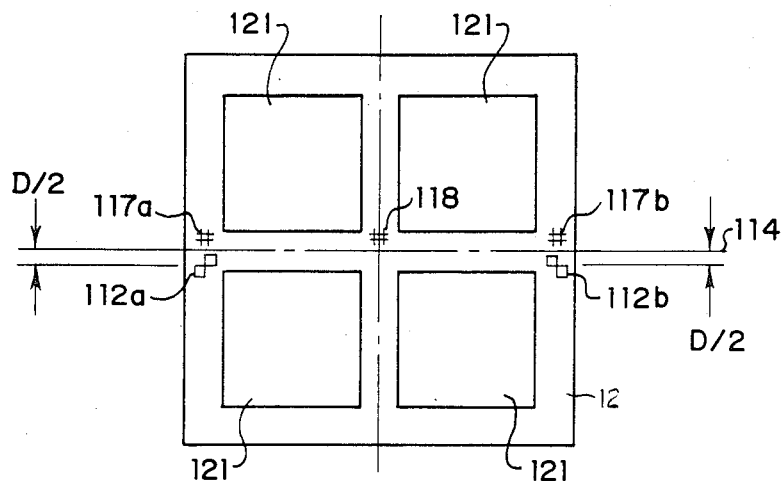
FIG. 3 is a plan view of a first level main reticle employed in the system of FIGS. 1A and 1B to allow photometric step-and-repeat printing of a first level of microcircuitry contained on that main reticle onto a semiconductive wafer.
Figures 4A, 4B:
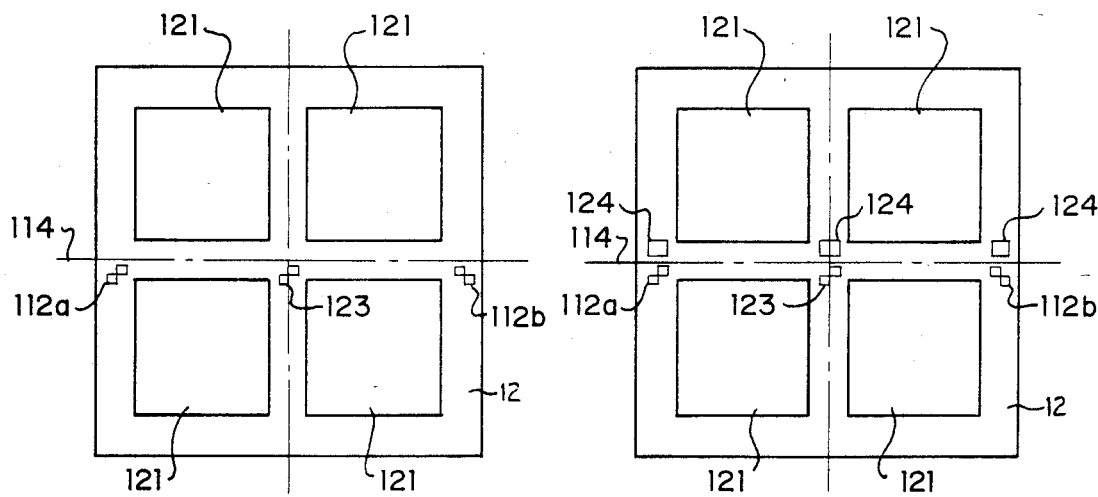
FIGS. 4A and 4B are plan views of second or higher level main reticles employed in the system of FIGS. 1A and 1B to allow photometric printing of a second or higher level of microcircuitry contained on those main reticles onto a semiconductive wafer coated with a positive photoresist and onto a semiconductive wafer coated with a negative photoresist, respectively.

The pair of right-hand and left-hand double-cross alignment marks 108a and 108b is employed for aligning an image of a corresponding pair of global alignment marks 112a and 112b contained on the main reticle 12 during the main reticle alignment operation. A pair of such global alignment marks 112a and 112b is contained on every first-level main reticle 12, as shown in FIG. 3, and also on every second-level and higher-level main reticle, as shown in FIGS. 4A and 4B. On each main reticle 12 the global alignment marks 112a and 112b are disposed in marginal areas adjacent to opposite sides of the main reticle and spaced a finite center-to-center distance D/2 (for example, 500 microns) below a centerline 114 of the main reticle. The global alignment marks 112a and 112b may each comprise a pair of light or transparent windows on a dark or opaque field as disclosed in U.S. patent applications Ser. Nos. 396,099 and 389,678.

During each step-and-repeat printing operation, images of the global alignment marks 112a and 112b on the main reticle 12 are first aligned with respect to the corresponding right-hand and left-hand double-cross alignment marks 108a and 108b of the reference mark 26 to precisely align the main reticle with respect to the orthogonal X and Y axes of motion of the main stage 24. This main reticle alignment operation may be performed in generally the same manner as described in U.S. patent application Ser. No. 396,099 by moving the shutter 68 to the closed position; by moving the main stage 24 to a position at which the reference mark 26 is centered directly beneath the projection lens 56; by moving the slide 78 to position the mask plate 84 at the operative position between the positive lenses 72 and 74 so that the global alignment marks 112a and 112b of the main reticle 12 are illuminated by blue exposure light, which passes through corresponding circular openings 116a and 116b in that mask plate and is imaged at those global alignment marks by the imaging lens 76, and so that the corresponding double-cross alignment marks 108a and 108b of the reference mark are illuminated by images of those illuminated global alignment marks; and by moving the reticle stage 16, while employing both objective lenses 90a and 90b of the split-field objective lens unit 88 and viewing the display screen 102 of the TV monitor 100, to align the images of the illuminated global alignment marks 112a and 112b of the main reticle with respect to the illuminated double-cross alignment marks 108a and 108b of the reference mark, as shown in FIG. 5.

As shown in FIG. 3, each first-level main reticle 12 contains another pair of global alignment marks 117a and 117b and one or more local alignment marks 118 to be photometrically printed onto each semiconductive wafer 14 to be processed with that first-level main reticle (a separate local alignment mark 118 is required for each second and higher level main reticle when performing alignment operations with blue exposure light whereas a single local alignment mark 118 is sufficient when performing alignment operations with yellow nonexposure light). On each such first-level main reticle 12, the global alignment marks 117a and 117b are disposed in marginal areas adjacent to opposite sides of the main reticle 12 and spaced the same finite center-to-center distance D/2 (for example, 500 microns) above the centerline 114 of the main reticle as the global alignment marks 112a and 112b are spaced below that centerline. The local alignment mark or marks 118 are disposed in a marginal area of each first-level main reticle 12 between the global alignment marks 117a and 117b (in the case of a first-level main reticle, which is to be used in performing alignment operations with yellow nonexposure light, and which therefore contains a single local alignment mark 118, that local alignment mark may, for example, also be spaced the same finite center-to-center distance D/2 above the centerline 114 of the main reticle). The global alignment marks 117a and 117b of the main reticle 12 may be photometrically printed as global alignment marks 119a and 119b in marginal areas of the semiconductive wafer 14, as shown in FIGS. 1A, 6 and 7, in the same manner as fully described in U.S. patent application Ser. No. 396,099.

The local alignment mark or marks 118 of each first-level main reticle 12 may be photometrically printed as local alignment mark or marks 120 on the semiconductor wafer 14 together with the first level of microcircuitry contained on that first-level main reticle in a step-and-repeat manner as shown in FIGS. 1A, 6 and 7 and as fully explained in U.S. patent application Ser. No. 396,099. This may be done either during the course of or immediately following the printing of the global alignment marks 117a and 117b of the same first-level main reticle 12 onto the semi-conductive wafer 14 and normally does not require any wafer alignment operation since no other level of microcircuitry has yet been photometrically printed onto or formed in the semiconductive wafer. If, as shown in FIGS. 3, 4A and 4B, the first-level and higher-level main reticles 12 contain four separate rectangular areas 121 of microcircuitry, and if, as shown in FIG. 3, the local alignment mark or marks 118 of each first-level main reticle are disposed in a central region between those four areas of microcircuitry, the four areas of microcircuitry of each first-level and higher-level main reticle will be repetitively photometrically printed onto the semiconductive wafer 14 within four corresponding inchoate dice regions 122 of the semiconductive wafer with the local alignment mark or marks 118 of each first-level main reticle being photometrically printed as local alignment mark or marks 120 in a central marginal area between those inchoate dice regions 122 of the semiconductive wafer, as shown in FIGS. 1A, 6 and 7. Although the global alignment marks 117a and 117b and the local alignment mark or marks 118 contained on the first-level main reticle 12 may, as shown, all comprise double-cross alignment marks such as those of the reference mark 26, different types of alignment marks could be used.

As best shown in FIGS. 4A and 4B, each second-level and higher-level main reticle 12 contains a local alignment mark 123 in a marginal area between the global alignment marks 112a and 112b. In the case of a second-level or higher-level main reticle 12, which is to be used in performing alignment operations with blue exposure light, this local alignment mark 123 is located at a position determined by the corresponding local alignment mark 118 on the associated first-level main reticle, as described in U.S. patent application Ser. No. 396,099. However, in the case of a second-level or higher-level main reticle 12, which is to be used with yellow nonexposure light, this local alignment mark is spaced below the centerline 114 of each such main reticle by the same finite center-to-center distance D/2 (for example, 500 microns) as the global alignment marks 112a and 112b. Although the local alignment mark 123 of each such main reticle 12 may, as shown, be of the same type as the global alignment marks 112a and 112b of each such main reticle, different types of local alignment marks could be used.

A second or higher level main reticle 12 of the type shown in FIG. 4A, is employed when processing a semi-conductive wafer 14 coated with a positive photoresist. However, if a main reticle 12, such as that shown in FIG. 4A, were employed when processing a semiconductive wafer 14 coated with a negative photoresist, the global and local double-cross alignment marks 119a, 119b and 120 of the semiconductive wafer 14 could be obliterated during subsequent processing. This problem can be eliminated by employing a second or higher level main reticle 12 of the type shown in FIG. 4B when processing a semiconductive wafer 14 coated with negative photoresist. A separate transparent rectangular window 124 is included on each such main reticle 2 adjacent to each of the global alignment marks 112a, 112b and 123 and spaced the same finite center-to-center distance D/2 above the centerline 114 of each such main reticle as the double-cross alignment marks 117a, 117b and 118 are spaced above the centerline 114 of each first-level main reticle 12. Thus, each such transparent rectangular window 124 of a second-level and higher-level main reticle 12 of the type shown in FIG. 4B serves to expose the negative photoresist overlying the corresponding double-cross alignment mark 117a, 117b or 118 of the semiconductive wafer 14 and thereby prevent subsequent processing from obliterating that double-cross alignment mark.

Following the main reticle alignment and photometric printing operations involving the first-level main reticle 12, and following the main reticle alignment operation involving each second-level and higher-level main reticle (all of which operations are performed as described above by employing the blue exposure light), the global alignment marks 119a and 119b printed at opposite sides of the semiconductive wafer 14 are each aligned with respect to an image of one of the global alignment marks 112a and 112b or with respect to an image of the local alignment mark 123 disposed on each second-level and higher-level main reticle to align the semiconductive wafer as a whole with respect to the orthogonal X and Y axes of motion of the main stage 24. This global wafer alignment operation may be performed in generally the same manner as described in U.S. patent application Ser. No. 396,099 in connection with the initial or set-up semiconductive wafer by retaining the shutter 68 in or moving it to the closed position; by moving the main stage 24 to a position at which a global alignment mark 119a or 119b of the semiconductive wafer 14 is nominally aligned, for example, with respect to an image of the local alignment mark 123 of the main reticle 12; by moving the slide 78 to position the mask plate 82 at the operative position between the positive lenses 72 and 74 so that the local alignment mark 123 of the main reticle is illuminated by blue exposure light, which passes through a rectangular opening 124 in that mask plate and is imaged at a central region of the main reticle (the central region including all of the areas of microcircuitry 121 and the local alignment mark 123, but not the global alignment marks 112a and 112b) by the imaging lens 76, and so that the global alignment mark 119a or 119b of the semiconductive wafer is illuminated by the image of the illuminated local alignment mark 123 of the main reticle; by moving the main stage 24, while employing either one of the objective lenses 90a and 90b of the split-field objective lens unit 88 and viewing the display screen 102 of the TV monitor 100, to align the global alignment mark 119a or 119b of the semiconductive wafer with respect to the image of the local alignment mark 123 of the main reticle; by repeating those of the foregoing steps necessary to align the other global alignment mark 119a or 119b of the semiconductive wafer with respect to the image of the same local alignment mark 123 of the main reticle; and by thereupon rotating the vacuum chuck 32 to position the aligned global alignment marks 119a and 119b at the same coordinate of the Y axis of the main stage.

Following the global wafer alignment operation the areas 121 of microcircuitry contained on the second-level or higher-level main reticle 12 may be photometrically printed onto the semiconductive wafer 14 in a step-and-repeat exposure operation in the same manner as described in U.S. patent application Ser. No. 396,099.

This is accomplished by moving the mask plate 82 to or retaining it in the operative position between positive lenses 72 and 74; by stepping the main stage 24 to different positions so as to successively locate different areas of the semiconductive wafer at a centered position directly beneath the projection lens 56; and by momentarily moving the shutter 68 to the open position at each such position of the main stage to expose the photoresistive film on the semiconductive wafer at each such area of the semiconductive wafer in accordance with the main reticle.

In the process of performing the foregoing step-and-repeat exposure operation, the local alignment mark 120 printed on the semiconductive wafer 14 in the central marginal area between each group of four inchoate dice regions 122 may also be aligned with respect to an image of the local alignment mark 123 of the second-level or higher-level main reticle 12 to more precisely align each of those inchoate dice regions with respect to an image of the main reticle before exposing the photoresistive film at those inchoate dice regions. This precision region-by-region or local wafer alignment operation may be performed in the same manner as described above in connection with the alignment of one of the global alignment marks 119a or 119b of the semiconductive wafer 14 and as described in U.S. patent application Ser. No. 396,099.

The system 10 includes an objective optical unit 128 for use in performing the aforementioned wafer alignment operations with the yellow nonexposure light if, for example, those alignment operations cannot be performed with the blue exposure light because the photoresistive film on the semiconductive wafer 14 is opaque to the blue exposure light. In order to provide the objective optical unit 128 with a secondary alignment standard with respect to which the semiconductive wafer 14 may be algined to perform those wafer alignment operations, the double-cross alignment mark 108A of the reference mark 26 is precisely aligned with respect to the image of the local alignment mark 123 of the main reticle 12. This is accomplished by moving the main stage 24 to a position at which the double-cross alignment mark 108A of the reference mark 26 is nominally aligned with respect to an image of the local alignment mark 123 of the main reticle 12, which has previously been precisely aligned with respect to the orthogonal X and Y axes of motion of the main stage 24 as described above; by moving the mask plate 82 to or retaining it in the operative position between the positive lenses 72 and 74 so as to illuminate the local alignment mark 123 of the main reticle and, hence, the double-cross alignment mark 108 A of the reference mark; by moving the shutter 68 to or retaining it in the closed position; and by moving the main stage 24, while employing either one of the objective lenses 92a and 92b of the split-field objective lens unit 88 and viewing the display screen 102 of the TV monitor 100, to precisely align the illuminated double-cross alignment mark 108A with respect to the image of the illuminated local alignment mark 123 of the previously-aligned main reticle 12.

Concomitantly, an image of an alignment mark 130 of the alignment reticle 44 (which is illuminated by the source 40 of yellow nonexposure light when a shutter 131 associated with that light source is opened, as shown in solid lines) is precisely aligned with respect to the double-cross alignment mark 110 of the reference mark 26 in a bore-sighting alignment operation as hereinafter described. This bore-sighting alignment operation is performed by employing the objective optical unit 128, together with the plane mirror 50, an astigmatism corrector 132, the cold mirror 52 and the projection lens 56, to project an image of the illuminated alignment mark 130 of the alignment reticle 44 into the image plane of the projection lens. The astigmatism corrector 132 is disposed in the first vertically-extending portion of the optical path 48 between the cold mirror 52 and the plane mirror 50 (but may be disposed anywhere in that optical path between the cold mirror and an objective lens 133 of the objective optical unit 128) to compensate for astigmatism produced by the cold mirror.

The source 40 of yellow nonexposure light and the alignment reticle 44 are disposed in a second vertically-extending portion of the optical path 48 with the shutter 131 pivotally disposed for blocking the passage of yellow nonexposure light from that light source to the alignment reticle when the shutter is closed, as shown in dashed lines, under control of a θ servo drive unit (not shown). An X-axis servo drive unit 134 and a Y-axis servo drive unit 136 are coupled to the alignment reticle 44 and employed for moving the alignment reticle along orthogonal X and Y axes of the alignment reticle to align the image of the illuminated alignment mark 130 of the alignment reticle with respect to the double-cross alignment mark 110 of the reference mark 26. A beam bender 138 is disposed for deflecting yellow nonexposure light, which is directed upwardly along the second vertically-extending portion of optical path 48 through the alignment mark 130 of the alignment reticle 44, forward along a horizontally-extending portion of that optical path through beam splitters 140 and 142 to the objective lens 133. The objective lens 133 is disposed along the horizontally-extending portion of the optical path 48 and is operable, together with the projection lens 56, to image the illuminated alignment mark 130 of the alignment reticle 44 at the image plane of the projection lens and also to directly view an aerial image 144 of the double-cross alignment mark 110 of the reference mark 26 as illuminated by the image of the illuminated alignment mark of the alignment reticle. The illuminated alignment mark 130 of the alignment reticle 44 may, as shown, be of the same type as the global and local alignment marks 112a, 112b and 123 of each main reticle 12.

Figure 9:
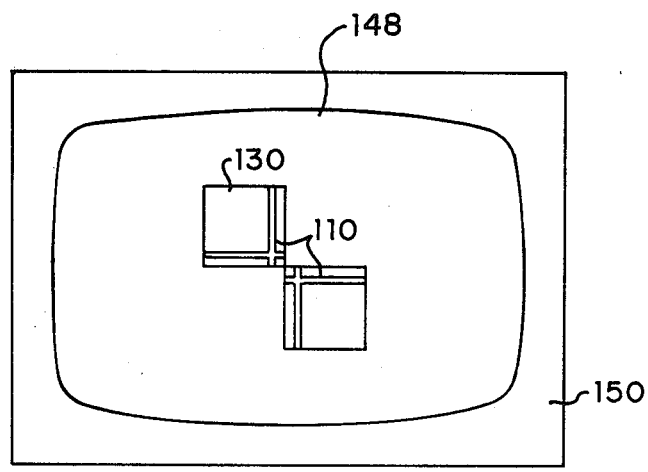
FIG. 9 is a view of a portion of the reference mark illuminated by an image of an alignment mark of an alignment reticle of the system of FIGS. 1A and 1B as viewed on the face of a second TV monitor of the system.

Yellow nonexposure light is reflected upwardly back along the vertically-extending portion of the optical path 18 from the illuminated double-cross alignment mark 110 of the reference mark 26 disposed in the image plane of the projection lens. This reflected yellow exposure light passes back through the projection lens 56, the cold mirror 52 and the astigmatism corrector 132 to the plane mirror 50, from which it is reflected to form the aerial image 144 of the double-cross alignment mark 110 of reference mark 26 (as illuminated by the image of the illuminated alignment mark 130 of the alignment reticle 44). The objective lens 133 reimages this aerial image 144 via the beam splitter 142 along a third vertically-extending portion of the optical path 48 at the input face of a TV camera 146. A view of this aerial image 144 is accordingly produced on the display screen 148 of a second TV monitor 150, which is coupled to the TV camera 146. While observing this view of the aerial image 144 provided by the second TV monitor 150, the X- and Y-axes servo drive units 134 and 136 may be employed for moving the alignment reticle 44 to precisely align the image of the alignment mark 130 of the alignment reticle with respect to the illuminated double-cross alignment mark 110 of the reference mark 26, as shown in FIG. 9. Since the corresponding double-cross alignment mark 108a of the reference mark 26 has concomitantly been aligned with respect to the image of the local alignment mark 123 of the second-level or higher-level main reticle 12, and since images of the global alignment marks 112a and 112b of that main reticle have previously been aligned with respect to the orthogonal X and Y axes of motion of the main stage 24, it may be seen that the image of the alignment mark 130 of the alignment reticle 44 has been bore-sighted into alignment with respect to the orthogonal X and Y axes of motion of the main stage.

Figure 10:
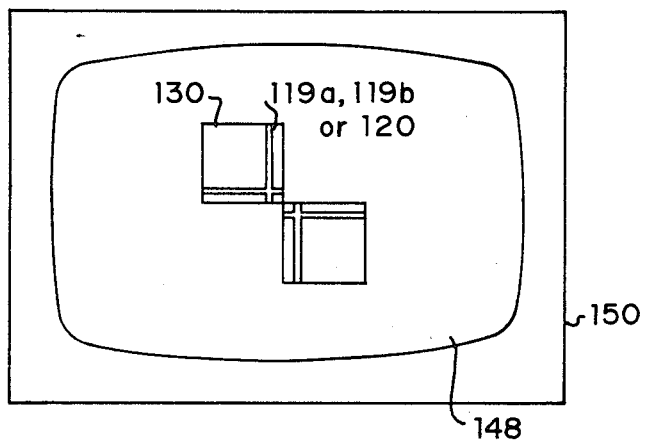
FIG. 10 is a view of a global or local alignment mark of a semiconductive wafer being aligned in the system of FIGS. 1A and 1B as illuminated by the image of the alignment mark of the alignment reticle and as viewed on the face of the second TV monitor of the system.

Following the foregoing bore-sighting alignment reticle set-up alignment operation, which may be repeated as often as desired to maintain the alignment accuracy of the system 10, both the global and local double-cross alignment marks 119a, 119b and 120 of the semiconductive wafer 14 can be precisely aligned with respect to the image of the illuminated alignment mark 130 of the alignment reticle 44 while employing the yellow nonexposure light. This may be done by employing the X- and Y-axes servo drive units 28 and 30 for moving the main stage 24 to a position at which the desired double-cross global or local alignment mark 119a, 119b or 120 of the semiconductive wafer 14 is centered directly beneath the projection lens 56 and illuminated by the image of the illuminated alignment mark 130 of the alignment reticle 44. Then, while observing the view of the aerial image 144 of that double-cross global or alignment mark 119a, 119b or 120, as illuminated by the image of the illuminated alignment mark 130 of the alignment reticle 144 and as provided on the screen 148 of the TV monitor 150, the X-, Y- and θ-axes servo drive units 28, 30 and 33 are employed as necessary for moving the main stage 24 and rotating the vacuum chuck 32 to align that illuminated double-cross alignment mark of the semiconductive wafer with respect to the image of the illuminated local alignment mark of the alignment reticle, as shown in FIG. 10. This operation may be performed in the same way when processing the semiconductive wafer 14 with any second-level or higher-level main reticle 12.

The objective optical unit 128 also includes an apertured field-stop plate 46 disposed along a fourth vertically-extending portion of the optical path 48 at the image plane of the objective lens 133 to provide a field stop 152. A second source 42 of nonexposure light is also disposed along the fourth vertically-extending portion of the optical path 48 so as to uniformly illuminate the field stop 152 with yellow nonexposure light when an associated shutter 154 is opened, as shown in dashed lines. When the shutter 154 is opened, the shutter 131 is normally closed. The yellow nonexposure light passing through the field stop 152 is reflected to the objective lens 133 by the beam splitter 140 and is imaged at the image plane of the projection lens 56 by that objective lens and the projection lens 56 so as to illuminate the entire field viewed in that image plane by the objective lens unit 128. This is especially helpful in locating the global alignment marks 119a and 119b on the semiconductive wafer 14 during the global alignment operation.

I claim:

1. A step-and-repeat alignment system for aligning first and second objects, said system comprising:
   first stage means for holding the first object;
   second stage means for holding the second object;
   a first reference indicium disposed on the second stage means;
   first optical means for producing an image of the first object in an image plane of the first optical means and for viewing an image of one of the first reference indicium and the second object as illuminated by the image of the first object;
   said first stage means being operable with the first optical means for aligning an image of a first portion of the first object with respect to a first portion of the first reference indicium;
   said second stage means being operable with the first optical means for aligning the second object with respect to an image of the first object and for aligning a second portion of the first reference indicium with respect to an image of a second portion of the first object;
   a second reference indicium;
   second optical means, operable with the first optical means, for producing an image of the second reference indicium in the image plane of the first optical means and for viewing an image of one of the first reference indicium and the second object as illuminated by the image of the second reference indicium; and
   adjustment means, operable with the first and second optical means, for aligning the image of the second reference indicium with respect to a third portion of the first reference indicium;
   said second stage means also being operable with the first and second optical means for aligning the second object with respect to the image of the second reference indicium.

2. A step-and repeat alignment and exposure system for aligning first and second objects, said system comprising:
   first stage means for holding the first object;
   second stage means, disposed on one side of the first stage means, for holding the second object;
   a reference indicium disposed on the second stage means;
   source means, disposed on the other side of the first stage means, for providing illumination and exposure light;
   said source means including shutter means operable in a closed position for enabling the source means to provide the illumination light and operable in an open position for enabling the source means to provide the exposure light;
   objective optical means, disposed on said other side of the first stage means, for viewing an image of the first and second objects;
   imaging optical means, disposed between the first stage means and both the source means and objective optical means, for imaging the illumination and exposure light from the source means at the first object to illuminate a portion of the first object; and
   projection optical means, disposed between the first and second stage means, for projecting an image of the illuminated portion of the first object to the second object;
   said imaging optical means being operable for imaging reflected illumination light from the first object at the objective optical means and being operable with the projection optical means for imaging reflected illumination light from the second object at the objective optical means.

3. A step-and-repeat alignment and exposure system as in claim 2 wherein said shutter means includes a neutral density filter operable when the shutter means is in the closed position for passing the illumination light.

4. A step-and-repeat alignment and exposure system as in claim 3 wherein the illumination light comprises exposure light of reduced intensity.

5. A step-and-repeat alignment and exposure system as in claim 4 wherein the neutral density filter is an $ND_3$ neutral density filter.

6. A step-and-repeat alignment and exposure system as in claim 2 including beam splitting means, disposed between the imaging optical means and the objective optical means, for deflecting illumination and exposure light from the source means to the first and second objects and for transmitting illumination light reflected from the first and second objects to the objective optical means.

7. A step-and-repeat alignment and exposure system as in claim 6 wherein the objective optical means comprises a splitfield objective lens unit.

8. A step-and-repeat alignment system for aligning first and second objects, said system comprising:
  first stage means for holding the first object;
  second stage means, disposed on one side of the first stage means, for holding the second object;
  a reference indicium disposed on the second stage means;
  source means, disposed on the other side of the first stage means, for providing light;
  objective optical means, disposed on said other side of the first stage means, for viewing an image of the first and second objects;
  imaging optical means, disposed between the first stage means and both the source means and objective optical means, for imaging light from the source means at the first object to illuminate portions of the first object; and
  projection optical means, disposed between the first and second stage means, for projecting an image of the illuminated portion of the first object to the second object;
  said imaging optical means being operable for imaging reflected light from the first object at the objective optical means and being operable with the projection optical means for imaging reflected light from the second object at the objective optical means.

9. A step-and-repeat alignment system as in claim 8 wherein said objective optical means comprises a split-field objective lens unit.

10. A step-and-repeat alignment system for aligning first and second objects, said system comprising:
  first positioning means for holding the first object;
  second positioning means for holding the second object;
  a first reference indicium disposed on the second positioning means;
  imaging means for producing an image of the first object in an image plane of the imaging means;
  first optical means, disposed on one side of the first positioning means and operable with the imaging means and viewing means, for viewing an aerial image of one of the first reference indicium and the second object as illuminated by the image of the first object;
  said first positioning means being operable for aligning the image of the first object with respect to the first reference indicium;
  third positioning means for holding a second reference indicium; and
  second optical means, disposed on the other side of the first positioning means and operable with the imaging means and viewing means, for producing an image of the second reference indicium in the image plane of the imaging means and for viewing an aerial image of one of the first reference indicium and the second object as illuminated by the image of the second reference indicium;
  said third positioning means being operable for aligning the image of the second reference indicium with respect to the first reference indicium.

11. A step-and-repeat alignment system as in claim 10 including beam-splitting means, disposed between the first positioning means and the imaging means, for facilitating the viewing of the first-mentioned aerial image and the second-mentioned aerial image.

12. A step-and-repeat alignment system as in claim 11 wherein each of said viewing means includes a TV camera.

13. A step-and-repeat alignment system as in claim 11 wherein:
  said system includes a source of illumination and exposure light; and
  said first optical means, beam-splitting means and imaging means are operable with the source of illumination and exposure light for producing the first-mentioned aerial image.

14. A step-and-repeat alignment system as in claim 13 wherein said first optical means includes:
  beam-splitting means, disposed between the first positioning means and the viewing means, for directing light from the source of illumination and exposure light to the first object and for directing reflected light from the first object to the viewing means;
  an objective lens unit, disposed between the last-mentioned beam-splitting means and the viewing means, for viewing the first-mentioned aerial image; and
  imaging means, disposed between the first positioning means and the last-mentioned beam-splitting means, for imaging light from the source of illumination and exposure light at the first object and for imaging reflected light from the first object at an object plane of the objective lens unit.

15. A step-and-repeat alignment system as in claim 14 wherein:
  said objective lens unit is a split-field objective lens unit; and
  said first optical means further includes a lens, disposed between the last-mentioned beam-splitting means and the split field objective lens unit and operable with the last-mentioned imaging means, for telecentrically imaging reflected light from the first object at the object plane of the split-field objective lens unit.

16. A step-and-repeat alignment system as in claim 15 wherein said first-mentioned viewing means comprises:
  a TV camera; and
  a TV monitor coupled to the TV camera.

17. A step-and-repeat alignment system as in claim 16 wherein:
  said first object comprises a reticle; and
  said second object comprises a semiconductive wafer.

18. A step-and-repeat alignment system as in claim 14 wherein said source includes:
   means for projecting a beam of illumination and exposure light towards the last-mentioned beam-splitting means; and
   means, including a neutral density filter, movable to a position in the path of the beam of illumination and exposure light for passing illumination light to the last-mentioned beam-splitting means and movable to another position out of the path of the beam of illumination and exposure light for permitting passage of exposure light to the last-mentioned beam-splitting means.

19. A step-and-repeat alignment system as in claim 18 wherein the illumination light comprises exposure light of reduced intensity.

20. A step-and-repeat alignment system as in claim 19 wherein said neutral density filter is an $ND_3$ neutral density filter.

21. A step-and-repeat alignment system as in claim 13 wherein said first optical means, beam-splitting means and imaging means are operable with the source of illumination and exposure light for producing the first-mentioned aerial image of the first reference indicium as illuminated by the image of the first object.

22. A step-and-repeat alignment system as in claim 21 wherein said first optical means includes beam-splitting means, disposed between the first positioning means and the first-mentioned viewing means, for directing light from the source of illumination and exposure light to the first object so that light passing through the first object is directed by the first-mentioned beam-splitting means through the imaging means to the first reference indicium, so that light reflected from the first reference indicium back through the imaging means is directed by the first-mentioned beam-splitting means through the first object and the first optical means, including the second-mentioned beam-splitting means, to the first-mentioned viewing means, and so that light reflected from the first object through the first optical means, including the second-mentioned beam-splitting means, is directed to the first-mentioned viewing means.

23. A step-and-repeat alignment system as in claim 21 wherein:
   said first reference indicium is aligned with respect to orthogonal axes of motion of the second positioning means;
   said first-mentioned aerial image comprises an aerial image of first and second spaced-apart alignment mark portions of the first reference indicium as illuminated by the image of corresponding first and second spaced-apart alignment mark portions of the first object; and
   said first positioning means may be employed, while viewing that aerial image, to bring the first and second alignment mark portions of the first reference indicium and the image of the corresponding first and second alignment mark portions of the first object into alignment and thereby align the first object with respect to the orthogonal axes of motion of the second positioning means.

24. A step-and-repeat alignment system as in claim 23 wherein said first-mentioned viewing means comprises:
   a TV camera; and
   a TV monitor coupled to the TV camera.

25. A step-and-repeat alignment system as in claim 23 wherein said first optical means includes a split-field objective lens unit.

26. A step-and-repeat alignment system as in claim 21 wherein:
   said first reference indicium and first object are aligned with respect to orthogonal axes of motion of the second positioning means;
   said first-mentioned aerial image comprises an aerial image of an alignment mark portion of the first reference indicium as illuminated by the image of a corresponding alignment mark portion of the first object; and
   said second positioning means may be employed, while viewing that aerial image, to bring the alignment mark portion of the first reference indicium and the image of the corresponding alignment mark portion of the first object into alignment.

27. A step-and-repeat alignment system as in claim 26 wherein said first-mentioned viewing means comprises:
   a TV camera; and
   a TV monitor coupled to the TV camera.

28. A step-and-repeat alignment system as in claim 11 wherein:
   said system includes a source of nonexposure light; and
   said second optical means, beam-splitting means and imaging means are operable with the source of nonexposure light for producing the second-mentioned aerial image of the first reference indicium as illuminated by the image of the second reference indicium.

29. A step-and-repeat alignment system as in claim 28 wherein said source is disposed for directing nonexposure light through the second reference indicium, the second optical means, the beam-splitting means and the imaging means to the image plane of the imaging means so that nonexposure light reflected from the first reference indicium through the imaging means is directed by the beam-splitting means through the second optical means to the second mentioned viewing means to produce the second-mentioned aerial image of the first reference indicium as illuminated by the image of the second reference indicium.

30. A step-and-repeat alignment system as in claim 29 wherein:
   said first reference indicium is aligned with respect to orthogonal axes of motion of the second positioning means;
   said second-mentioned aerial image comprises an aerial image of an alignment mark portion of the first reference indicium as illuminated by the image of the second reference indicium; and
   said third positioning means may be employed, while viewing that aerial image, to bring the alignment mark portion of the first reference indicium and the image of the second reference indicium into alignment and thereby align the second reference indicium with respect to the orthogonal axes of motion of the second positioning means.

31. A step-and-repeat alignment system as in claim 30 wherein said second-mentioned viewing means comprises:
   a TV camera; and
   a TV monitor coupled to the TV camera.

32. A step-and-repeat alignment system as in claim 11 wherein:
   said first optical means is operable with the beam-splitting means, the imaging means and the first-mentioned viewing means for viewing the first-mentioned aerial image of an alignment mark portion of the first reference indicium as illuminated by the image of a corresponding alignment mark portion of the first object; and said second optical means is operable with the beam-splitting means and the imaging means for producing the image of the second reference indicium in the image plane of the imaging means and is operable with the beam-splitting means, the imaging means and the second-mentioned viewing means for viewing the second-mentioned aerial image of an alignment mark portion of the first reference indicium as illuminated by the image of the second reference indicium.

33. A step-and-repeat alignment system as in claim 32 wherein:

said first-mentioned viewing means comprises a first TV camera; and said second-mentioned viewing means comprises a second TV camera.

34. A step-and-repeat alignment system as in claim 32 wherein:

said system includes a source of exposure light;

said first optical means, beam-splitting means and imaging means are operable with the source of exposure light for producing the first-mentioned aerial image of the alignment mark portion of the first reference indicium as illuminated by the image of the corresponding alignment mark portion of the first object;

said system includes a source of nonexposure light; and said second optical means, beam-splitting means and imaging means are operable with the source of nonexposure light for producing the second-mentioned aerial image of the alignment mark portion of the first reference indicium as illuminated by the image of the second reference indicium.

35. A step-and-repeat alignment system as in claim 34 wherein said first-mentioned alignment mark portion of the first reference indicium and said second-mentioned alignment mark portion of the first reference indicium comprise separate alignment mark portions spaced apart by a predetermined finite distance.

36. A step-and-repeat alignment system as in claim 35 wherein:

said source of exposure light is disposed for directing exposure light to the first object so that exposure light passing through the first object, the beam-splitting means and the imaging means to the image plane of the imaging means and reflected from the first reference indicium back through the imaging means is directed by the beam-splitting means through the first object and the first optical means to the first-mentioned viewing means and so that exposure light reflected from the first object is directed through the first optical means to the first-mentioned viewing means; and said source of nonexposure light is disposed for directing nonexposure light through the second reference indicium, the second optical means, the beam-splitting means and the imaging means to the image plane of the imaging means so that nonexposure light reflected from the first reference indicium back through the imaging means is directed by the beam-splitting means through the second optical means to the second-mentioned viewing means.

37. A step-and-repeat alignment system as in claim 36 wherein:

said first reference indicium and first object are aligned with respect to orthogonal axes of motion of the second positioning means;

said second positioning means may be employed, while viewing the first-mentioned aerial image, to bring the first-mentioned alignment mark portion of the first reference indicium and the image of the corresponding alignment mark portion of the first object into alignment; and said third positioning means may concomitantly be employed, while viewing the second-mentioned aerial image, to bring the second-mentioned alignment mark portion of the first reference indicium and the image of the second reference indicium into alignment and thereby align the second reference indicium with respect to the orthogonal axes of motion of the second positioning means.

38. A step-and-repeat alignment system as in claim 37 wherein:

said first-mentioned viewing means comprises a first TV camera and a first TV monitor coupled to the first TV camera; and said second-mentioned viewing means comprises a second TV camera and a second TV monitor coupled to the second TV camera.

39. A step-and-repeat alignment system as in claim 38 wherein:

said first object comprises a reticle; and said second object comprises a semiconductive wafer.

40. A step-and-repeat alignment system as in claim 39 wherein:

said source of exposure light comprises a source of blue exposure light; and said source of nonexposure light comprises a source of yellow nonexposure light.

41. A step-and-repeat alignment system as in claim 34 wherein said first optical means includes:

an objective lens unit; and beam-splitting means disposed for deflecting exposure light from the source of exposure light to the first object and for transmitting exposure light from the first object to the objective lens unit.

42. A step-and-repeat alignment system as in claim 41 wherein:

said first-mentioned beam-splitting means comprises a chromatic beam splitter; and said second-mentioned beam-splitting means comprises a nonchromatic beam splitter.

43. A step-and-repeat alignment system as in claim 34 wherein said beam-splitting means comprises a chromatic beam splitter for deflecting the exposure light and for transmitting the nonexposure light.

44. A step-and-repeat alignment system as in claim 43 wherein said chromatic beam splitter comprises a cold mirror.

45. A step-and-repeat alignment system as in claim 44 including a means, disposed between the cold mirror and the second optical means, for compensating for astigmatism produced by the cold mirror.

46. A step-and-repeat alignment system as in claim 34 wherein said second optical means includes beam-splitting means disposed for transmitting nonexposure light from the second reference indicium to the first-mentioned beam-splitting means and for deflecting nonexposure light from the first-mentioned beam-splitting means to the second-mentioned viewing means.

47. A step-and-repeat alignment system as in claim 11 wherein said second optical means includes objective means, operable with the beam-splitting means, the imaging means and the second-mentioned viewing means, for viewing the second-mentioned aerial image of an alignment mark portion of the second object as illuminated by the image of the second reference indicium.

48. A step-and-repeat alignment system as in claim 47 wherein said second-mentioned viewing means comprises a TV camera.

49. A step-and-repeat alignment system as in claim 47 wherein:
said system includes a source of nonexposure light; and
said objective means, beam-splitting means and imaging means are operable with the source of nonexposure light for producing the second-mentioned aerial image of the alignment mark portion of the second object as illuminated by the image of the second reference indicium.

50. A step-and-repeat alignment system as in claim 49 wherein said source is disposed for directing nonexposure light through the second reference indicium, the objective means, the beam-splitting means and the imaging means to the image plane of the imaging means so that nonexposure light reflected from the alignment mark portion of the second object back through the imaging means is directed by the beam-splitting means through the objective means to the second-mentioned viewing means to produce the second-mentioned aerial image of the alignment mark portion of the second object as illuminated by the image of the second reference indicium.

51. A step-and-repeat alignment system as in claim 50 wherein:
said second reference indicium is aligned with respect to orthogonal axes of motion of the second positioning means; and
said second positioning means may be employed, while viewing the second-mentioned aerial image, to bring the alignment mark portion of the second object and the image of the second reference indicium into alignment and thereby align the second object with respect to the orthogonal axes of motion of the second positioning means.

52. A step-and-repeat alignment system as in claim 51 wherein said second-mentioned viewing means comprises:
a TV camera; and
a TV monitor coupled to the TV camera.

53. A step-and-repeat alignment system as in claim 49 wherein said second optical means includes field illumination means, operable with the objective means, the beam-splitting means and the imaging means, for selectively illuminating the field viewed in the image plane of the imaging means by the objective means with nonexposure light.

54. A step-and-repeat alignment system as in claim 53 wherein said second optical means includes beam-splitting means, disposed between the first-mentioned beam-splitting means and the second reference indicium, for deflecting nonexposure light from the field illumination means through the objective means, the first-mentioned beam-splitting means and the imaging means to the image plane of the imaging means and for transmitting nonexposure light from the second reference indicium through the objective means, the first-mentioned beam-splitting means and the imaging means to the image plane of the imaging means.

55. A step-and-repeat alignment system as in claim 54 wherein:
said field illumination means includes field stop means for defining a field stop;
said system includes another source of nonexposure light for directing nonexposure light through the field stop;
said second-mentioned beam-splitting means, objective means, first-mentioned beam-splitting means and imaging means are operable for imaging nonexposure light passing through the field stop into the image plane of the imaging means; and
said system includes shutter means disposed for selectively permitting the passage of nonexposure light from the first-mentioned source of nonexposure light through the second reference indicium or alternatively from the second-mentioned source of nonexposure light through the field stop.

56. A step-and-repeat alignment system as in claim 11 wherein:
said first reference indicium and second reference indicium are aligned with respect to orthogonal axes of motion of the second positioning means;
said first optical means is operable with the imaging means for viewing the first-mentioned aerial image of an alignment mark portion of the first reference indicium as illuminated by an image of a corresponding alignment mark portion of the first object;
said first positioning means may be employed, while viewing the first-mentioned aerial image, to bring the alignment mark portion of the first reference indicium and the image of the corresponding alignment mark portion of the first object into alignment and thereby align the first object with respect to the orthogonal axes of motion of the second positioning means;
said second optical means is operable with the imaging means for viewing the second-mentioned aerial image of an alignment mark portion of the second object as illuminated by the image of the second reference indicium;
said second positioning means may be employed, while viewing the second-mentioned aerial image, to bring the alignment mark portion of the second object and the image of the second reference indicium into alignment and thereby align the second object with respect to the orthogonal axes of motion of the second positioning means;
said system includes a source of exposure light disposed for directing exposure light through the first object, the beam-splitting means and the imaging means onto a surface of the second object in the image plane of the imaging means to photometrically print the image of the first object on that surface of the second object; and
said first object includes a selected portion imaged by the first optical means onto the surface of the second object over the alignment mark portion of the second object to prevent the alignment mark portion of the second object from being obliterated by the image of the first object photometrically printed on the surface of the second object.

57. A step-and-repeat alignment system as in claim 56 wherein:

said alignment mark portion of the first reference indicium comprises first and second spaced-apart alignment marks;

said alignment mark portion of the first object comprises corresponding first and second spaced-apart alignment marks;

said alignment mark portion of the second object comprises one or more alignment marks, each of which may be successively aligned with respect to the image of the second reference indicium;

said second reference indicium comprises an alignment mark; and said selected portion of the first object comprises one or more regions corresponding to the alignment marks of the second object.

58. A step-and-repeat alignment system as in claim 10 wherein:

said system includes a source of exposure light disposed for directing exposure light through the first object and the imaging means onto a photoresistive surface of the second object in the image plane of the imaging means to photometrically print the image of the first object on the photoresistive surface of the second object; and said first object includes one or more selected regions imaged by the imaging means onto the photoresistive surface of the second object over one or more corresponding alignment mark portions of the second object to prevent those one or more alignment mark portions of the second object from being obliterated by the image of the first object photometrically printed on the photoresistive surface of the second object.

59. A step-and-repeat alignment system as in claim 58 wherein:

said photoresistive surface of the second object is provided by a coating of positive photoresist; and each of said one or more selected regions of the first object is transparent to the exposure light.

60. A step-and-repeat alignment system as in claim 11 wherein:

said system includes a source of exposure light;

said first optical means, beam-splitting means and imaging means are operable with the source of exposure light for producing the first-mentioned aerial image;

said system includes a source of nonexposure light; and said second optical means, beam-splitting means and imaging means are operable with the source of nonexposure light for producing the second-mentioned aerial image.

61. A step-and-repeat alignment system as in claim 60 wherein said beam-splitting means comprises a chromatic beam splitter for deflecting the exposure light and for transmitting the nonexposure light.

62. A step-and-repeat alignment system as in claim 61 wherein said chromatic beam splitter comprises a cold mirror.

63. A step-and-repeat alignment system as in claim 62 including means for compensating for astigmatism produced by the cold mirror.

64. A step-and-repeat alignment system as in claim 63 wherein said last-mentioned means comprises an astigmatism corrector disposed between the cold mirror and the second optical means.

65. A step-and-repeat alignment system as in claim 61 wherein:

said source of exposure light comprises a source of blue exposure light; and said source of nonexposure light comprises a source of yellow nonexposure light.

66. A step-and-repeat alignment system as in claim 60 wherein:

said first object comprises a reticle; and said second object comprises a semiconductive wafer.

67. A step-and-repeat alignment system as in claim 60 wherein said first optical means includes:

an objective lens unit; and beam-splitting means, disposed between the first positioning means and the objective lens unit, for directing exposure light from the source of exposure light to the first object and for directing exposure light from the first object to the objective lens unit.

68. A step-and-repeat alignment system as in claim 60 wherein said second optical means includes:

an objective lens; and beam-splitting means, disposed between the second reference indicium and the first-mentioned beam-splitting means, for directing nonexposure light from the source of nonexposure light to the first-mentioned beam-splitting means and for directing nonexposure light from the first-mentioned beam-splitting means to the second-mentioned viewing means.

* * * * *